United States Patent
Yuan et al.

(10) Patent No.: US 11,009,562 B2
(45) Date of Patent: May 18, 2021

(54) MAGNETIC FIELD SENSING APPARATUS

(71) Applicants: Fu-Te Yuan, New Taipei (TW);
Meng-Huang Lai, New Taipei (TW)

(72) Inventors: Fu-Te Yuan, New Taipei (TW);
Meng-Huang Lai, New Taipei (TW)

(73) Assignee: iSentek Inc., New Taipei (TW)

( * ) Notice: Subject to any disclaimer, the term of this patent is extended or adjusted under 35 U.S.C. 154(b) by 24 days.

(21) Appl. No.: 16/522,674

(22) Filed: Jul. 26, 2019

(65) Prior Publication Data

US 2020/0041580 A1    Feb. 6, 2020

Related U.S. Application Data

(60) Provisional application No. 62/714,094, filed on Aug. 3, 2018.

(30) Foreign Application Priority Data

Jun. 24, 2019    (TW) ................ 108121871

(51) Int. Cl.
*G01R 15/18*     (2006.01)
*G01R 33/00*     (2006.01)
(Continued)

(52) U.S. Cl.
CPC .......... *G01R 33/0011* (2013.01); *G01B 7/14* (2013.01); *G01R 33/0005* (2013.01);
(Continued)

(58) Field of Classification Search
CPC .............. G01R 33/0011; G01R 33/093; G01R 33/098; G01R 15/185; G01R 15/205;
(Continued)

(56) References Cited

U.S. PATENT DOCUMENTS

| 10,066,940 | B2 | 9/2018 | Deak et al. |
| 2004/0100270 | A1* | 5/2004 | Fischer ................. G01R 31/34 |
| | | | 324/510 |

(Continued)

FOREIGN PATENT DOCUMENTS

| CN | 202216701 | 5/2012 |
| CN | 103543417 | 1/2014 |

(Continued)

OTHER PUBLICATIONS

Translation of TW-I516785B (Year: 2016).*

(Continued)

*Primary Examiner* — Huy Q Phan
*Assistant Examiner* — Adam S Clarke
(74) *Attorney, Agent, or Firm* — JCIPRNET

(57) ABSTRACT

A magnetic field sensing apparatus including a magnetic flux concentrator and a plurality of single direction magneto-resistive sensors is provided. The magnetic flux concentrator has a first and a second end portions opposite to each other. The single direction magneto-resistive sensors have the same pinning direction and are disposed beside the magnetic flux concentrator. The single direction magneto-resistive sensors further include a plurality of first and second single direction magneto-resistive sensors. The first single direction magneto-resistive sensors are disposed beside the first end portion and further include a first and a third portions respectively being disposed two opposite sides of the first end portion. The first and a third portions are coupled to a first full Wheatstone bridge. The second single direction magneto-resistive sensors are disposed beside the second end portion and further include a second and a fourth portions respectively being disposed two opposite sides of the second end portion. The second and the fourth portions are coupled to a second full Wheatstone bridge.

8 Claims, 14 Drawing Sheets

(51) Int. Cl.
*G01R 33/09* (2006.01)
*H01L 43/08* (2006.01)
*G01B 7/14* (2006.01)

(52) U.S. Cl.
CPC ......... *G01R 33/093* (2013.01); *G01R 33/098* (2013.01); *H01L 43/08* (2013.01)

(58) Field of Classification Search
CPC .. G01R 17/10; G01R 17/105; G01R 33/0005; G01R 33/0023; G01R 33/0094; G01R 33/09; G01R 33/091
See application file for complete search history.

(56) References Cited

U.S. PATENT DOCUMENTS

| | | |
|---|---|---|
| 2013/0265039 A1 | 10/2013 | Cai et al. |
| 2014/0015525 A1 | 1/2014 | Paci et al. |
| 2015/0108974 A1* | 4/2015 | Kennedy .............. G01R 33/098 324/252 |
| 2015/0137804 A1* | 5/2015 | Yuan ................. G01R 33/0011 324/244 |

FOREIGN PATENT DOCUMENTS

| | | |
|---|---|---|
| CN | 104678331 | 6/2015 |
| TW | 201520574 | 6/2015 |
| TW | 201520575 | 6/2015 |

OTHER PUBLICATIONS

Translation of CN 202216701U (Year: 2012).*
"Office Action of Taiwan Counterpart Application", dated Jan. 20, 2020, p. 1-p. 8.

* cited by examiner

MAGNETIC FIELD SENSING APPARATUS

CROSS-REFERENCE TO RELATED APPLICATION

This application claims the priority benefits of U.S. provisional application Ser. No. 62/714,094, filed on Aug. 3, 2018, and Taiwan application serial no. 108121871, filed on Jun. 24, 2019. The entirety of each of the above-mentioned patent applications is hereby incorporated by reference herein and made a part of this specification.

BACKGROUND OF THE INVENTION

1. Field of the Invention

The present invention relates to a magnetic field sensing apparatus.

2. Description of Related Art

With the development of technology, electronic products with navigation and positioning functions are becoming more and more diverse. The electronic compass provides the equivalent of a traditional compass in the fields of automotive navigation, flight and personal hand-held devices. In order to realize the function of the electronic compass, the magnetic field sensing apparatus becomes a necessary electronic component.

In order to achieve uniaxial sensing, a giant magnetoresistance (GMR) multilayer film structure or a tunneling magnetoresistance (TMR) multilayer film structure generally forms a full Wheatstone bridge, and these magnetoresistance multilayer film structures are designed to have two pinning directions that are anti-parallel to each other. For example, in order to achieve triaxial sensing, six pinning directions, every two of which are anti-parallel to each other, are required. However, designing different pinning directions on the antiferromagnetic layer on the wafer can result in manufacturing difficulties, incurring additional costs, and reducing the stability of the pinning layer.

SUMMARY OF THE INVENTION

The present invention provides a magnetic field sensing apparatus which is simple to manufacture and low in production cost and has good stability.

In an embodiment of the present invention, a magnetic field sensing apparatus including a magnetic flux concentrator and a plurality of single direction magneto-resistive sensors is provided. The magnetic flux concentrator has a first end portion and a second end portion opposite to each other. The single direction magneto-resistive sensors have the same pinning direction. The single direction magneto-resistive sensors are disposed beside the magnetic flux concentrator. The single direction magneto-resistive sensors further include a plurality of first single direction magneto-resistive sensors and a plurality of second single direction magneto-resistive sensors. The first single direction magneto-resistive sensors are disposed beside the first end portion, and the first single direction magneto-resistive sensors further include a first portion and a third portion respectively disposed on two opposite sides of the first end portion. The first portion and the third portion are coupled to form first full Wheatstone bridge. The second single direction magneto-resistive sensors are disposed beside the second end portion. The second single direction magneto-resistive sensors further include a second portion and a fourth portion respectively disposed on two opposite sides of the second end portion, and the second portion and the fourth portion are coupled to form a second full Wheatstone bridge.

In an embodiment of the present invention, the magnetic field sensing apparatus further includes a calculator coupled to the magneto-resistive sensors. The first full Wheatstone bridge is affected by an external magnetic field to output a first electrical signal. The second full Wheatstone bridge is affected by the external magnetic field to output a second electrical signal. The calculator determines magnetic field components of the external magnetic field in two different directions according to the first electrical signal and the second electrical signal.

In an embodiment of the present invention, the magneto-resistive sensors further include a plurality of third single direction magneto-resistive sensors. The third single direction magneto-resistive sensors are disposed beside the magnetic flux concentrator. The magnetic flux concentrator further includes a middle portion. The middle portion is located between the first end portion and the second end portion and connected to the first end portion and the second end portion. At least a portion of the third single direction magneto-resistive sensors are disposed to overlap the middle portion.

In an embodiment of the present invention, the magnetic field sensing apparatus further includes a time division switching circuit coupled to the magneto-resistive sensors. In a first time interval, the time division switching circuit couples the first portion and the third portion to form the first full Wheatstone bridge, and couples the second portion and the fourth portion to form the second full Wheatstone bridge, so that the calculator determines magnetic field components of the external magnetic field in the two different directions according to the first electrical signal and the second electrical signal. In a second time interval, the time division switching circuit couples at least a portion of the single direction magneto-resistive sensors selected from the first portion, the second portion, the third portion and the fourth portion to the third single direction magneto-resistive sensors to form a third full Wheatstone bridge. The third full Wheatstone bridge is affected by the external magnetic field to output a third electrical signal. The calculator determines a magnetic field component of the external magnetic field in the other direction according to the third electrical signal, wherein the magnetic field component in the other direction is different from the magnetic field components in the two different directions.

In an embodiment of the present invention, the third single direction magneto-resistive sensors further include a fifth portion and a sixth portion. The fifth portion is disposed to overlap the middle portion, and the sixth portion further includes two sixth sub-portions. The two sixth sub-portions are respectively disposed on two opposite sides of the middle portion and not disposed to overlap the middle portion.

In an embodiment of the present invention, the magnetic field sensing apparatus further includes a time division switching circuit coupled to the magneto-resistive sensors. In a first time interval, the time division switching circuit couples the first portion and the third portion to form the first full Wheatstone bridge, and couples the second portion and the fourth portion to form the second full Wheatstone bridge, so that the calculator determines magnetic field components of the external magnetic field in the two different directions according to the first electrical signal and the second electrical signal. In a second time interval, the time division switching circuit couples at least a portion of the single direction magneto-resistive sensors selected from the first portion, the second portion, the third portion and the fourth portion to the third single direction magneto-resistive sensors to form a third full Wheatstone bridge. The third full Wheatstone bridge is affected by the external magnetic field to output a third electrical signal. The calculator determines a magnetic field component of the external magnetic field in the other direction according to the third electrical signal, wherein the magnetic field component in the other direction is different from the magnetic field components in the two different directions.

In an embodiment of the present invention, the magneto-resistive sensors further include a plurality of third single direction magneto-resistive sensors. The third single direction magneto-resistive sensors are disposed beside the magnetic flux concentrator and include a fifth portion and a sixth portion. The magnetic flux concentrator has two short sides and two long sides. Any one of the two short sides is connected to the two long sides. The first end portion and the second end portion respectively include a portion of the two long sides and one of the two short sides. The first portion and the third portion are respectively disposed beside the two long sides belonging to the first end portion. The second portion and the fourth portion are respectively disposed beside the two long sides belonging to the second end portion. The fifth portion is disposed beside the short side belonging to the first end portion and not disposed to overlap the first end portion. The sixth portion is disposed beside the short side belonging to the second end portion and not disposed to overlap the second end portion.

In an embodiment of the present invention, the magnetic field sensing apparatus further includes a time division switching circuit coupled to the magneto-resistive sensors. In a first time interval, the time division switching circuit couples the first portion and the third portion to form the first full Wheatstone bridge, and couples the second portion and the fourth portion to form the second full Wheatstone bridge, so that the calculator determines magnetic field components of the external magnetic field in the two different directions according to the first electrical signal and the second electrical signal. In a second time interval, the time division switching circuit couples the fifth portion and the sixth portion to form a third full Wheatstone bridge. The third full Wheatstone bridge outputs a third electrical signal according to the external magnetic field. The calculator determines a magnetic field component of the external magnetic field in the other direction according to the third electrical signal, wherein the magnetic field component in the other direction is different from the magnetic field components in the two different directions.

In an embodiment of the present invention, the magnetic field sensing apparatus further includes a single direction magnetic field sensing element coupled to the calculator. The single direction magnetic field sensing element is affected by the external magnetic field to output a third electrical signal. The calculator determines a magnetic field component of the external magnetic field in the other direction according to the third electrical signal, wherein the magnetic field component in the other direction is different from the magnetic field components in the two different directions.

In an embodiment of the present invention, the type of the single direction magneto-resistive sensor includes a giant magneto-resistive sensor or a tunneling magneto-resistive sensor.

Based on the above, in the magnetic field sensing apparatus of the embodiments of the present invention, multi-axial sensing is realized by the pinning direction of the single direction magneto-resistive sensors having the same pinning direction, so that the magnetic field sensing apparatus is simple in manufacturing process and low in cost and has good stability.

In order to make the aforementioned and other objectives and advantages of the present invention comprehensible, embodiments accompanied with figures are described in detail below.

BRIEF DESCRIPTION OF THE DRAWINGS

FIG. 5A to FIG. 7A are top schematic views of a magnetic field sensing apparatus of different embodiments of the present invention in a first time interval;

FIG. 5B to FIG. 7B are respectively top schematic views of a magnetic field sensing apparatus of FIG. 5A and FIG. 7A in a second time interval.

DESCRIPTION OF THE EMBODIMENTS

In order to facilitate the description of the configuration of the magnetic field sensing apparatus of the embodiments of the present invention, the magnetic field sensing apparatus can be regarded as being in a space formed by the directions D1, D2 and D3, and the directions D1, D2 and D3 are perpendicular to each other.

Figure 1:
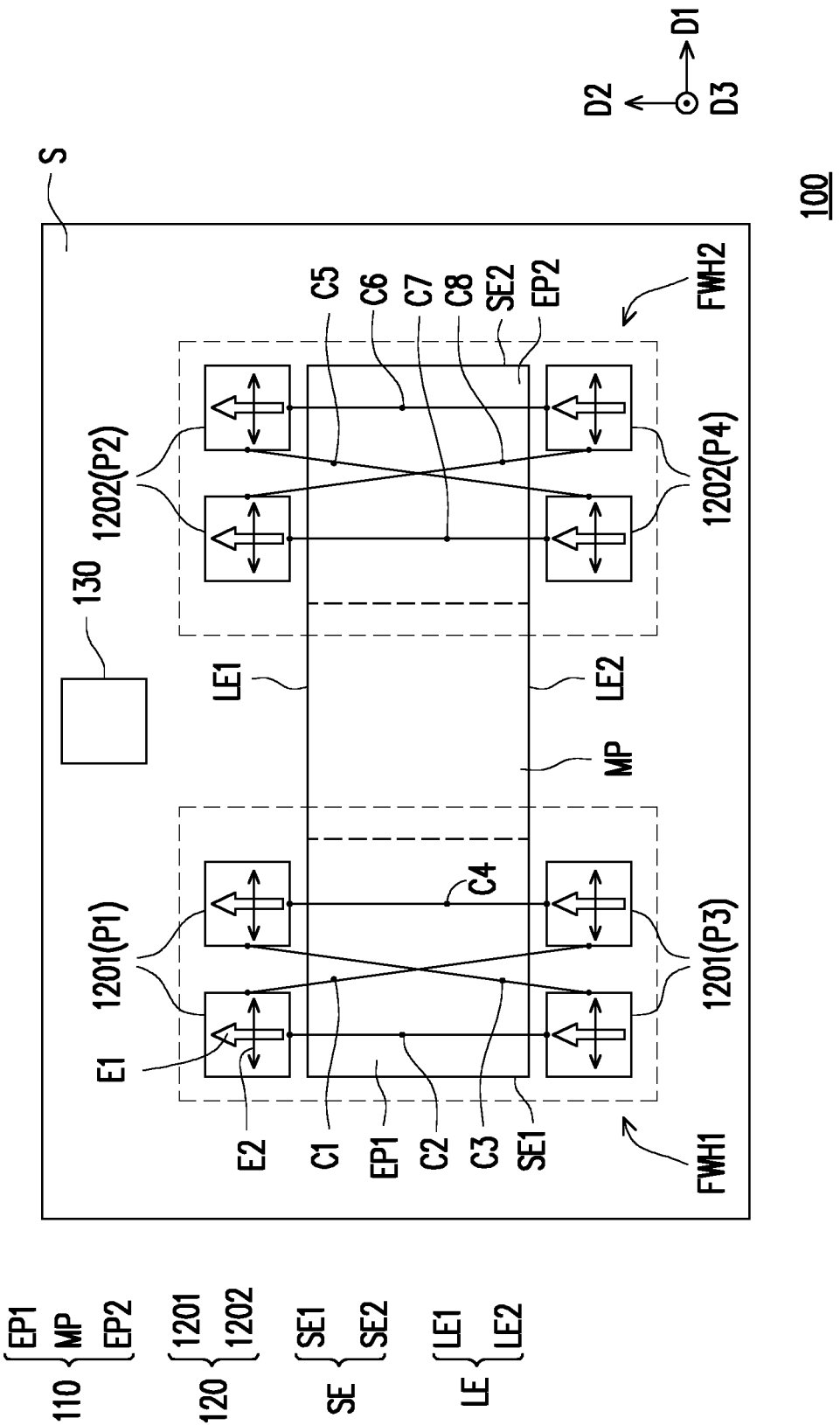
FIG. 1 is a top schematic structural view of a magnetic field sensing apparatus according to an embodiment of the present invention.
Figure 2A:
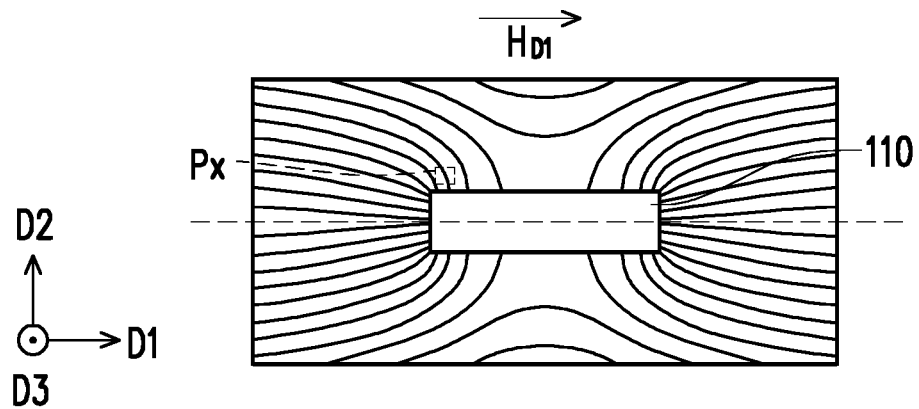
FIG. 2A, FIG. 2B and FIG. 2C are respectively magnetic line of force simulation diagrams of an external magnetic field converted by a magnetic flux concentrator when an external magnetic field in different directions is applied to the magnetic field sensing apparatus of FIG. 1.
Figure 2B:
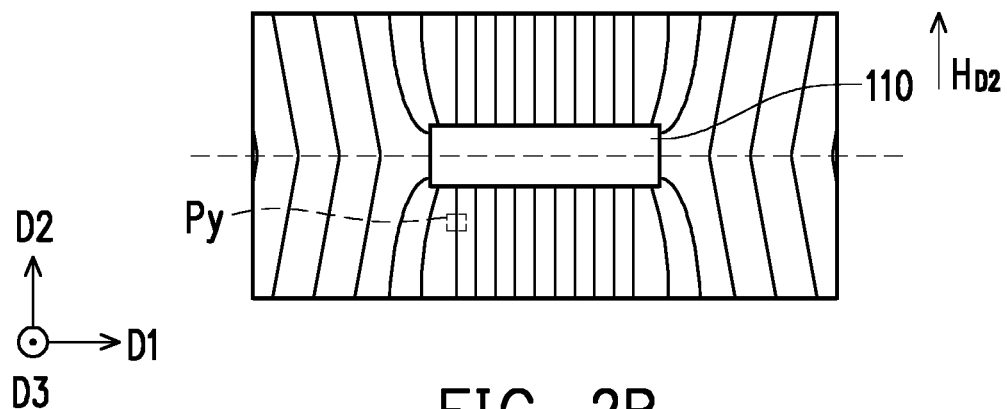
Figure 2C:
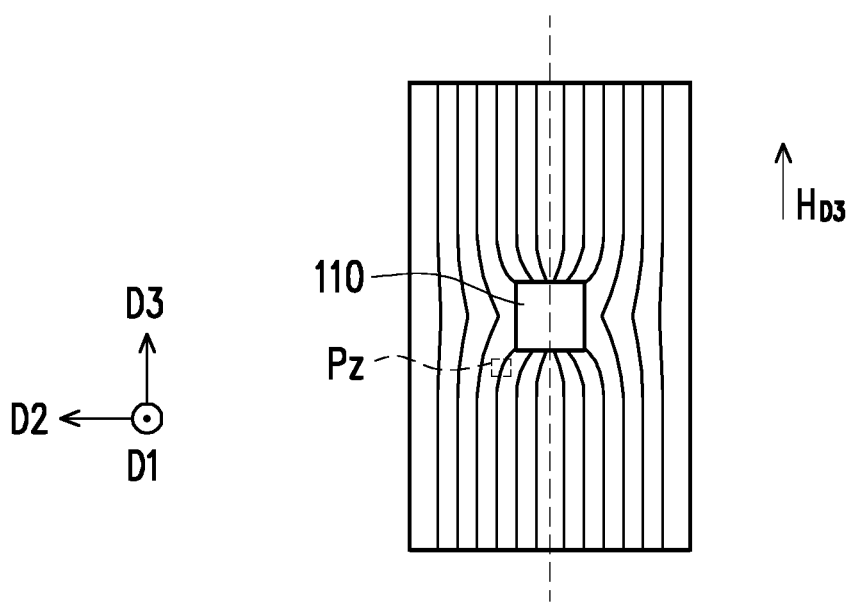
Figure 3A:
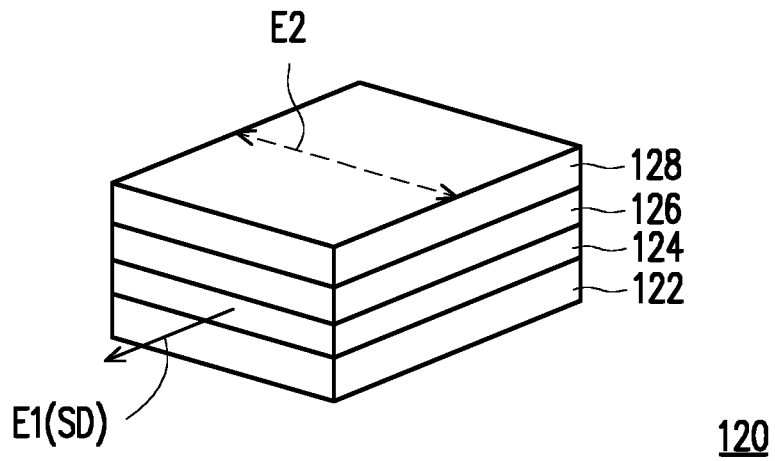
FIG. 3A is a three-dimensional schematic view of a multilayer film structure of the single direction magneto-resistive sensor of FIG. 1.
Figure 3B:
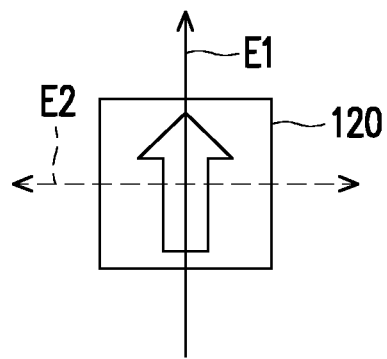
FIG. 3B shows the pinning direction of the single direction magneto-resistive sensor of FIG. 3A and the easy magnetization axis of the free layer.
Figure 3C:
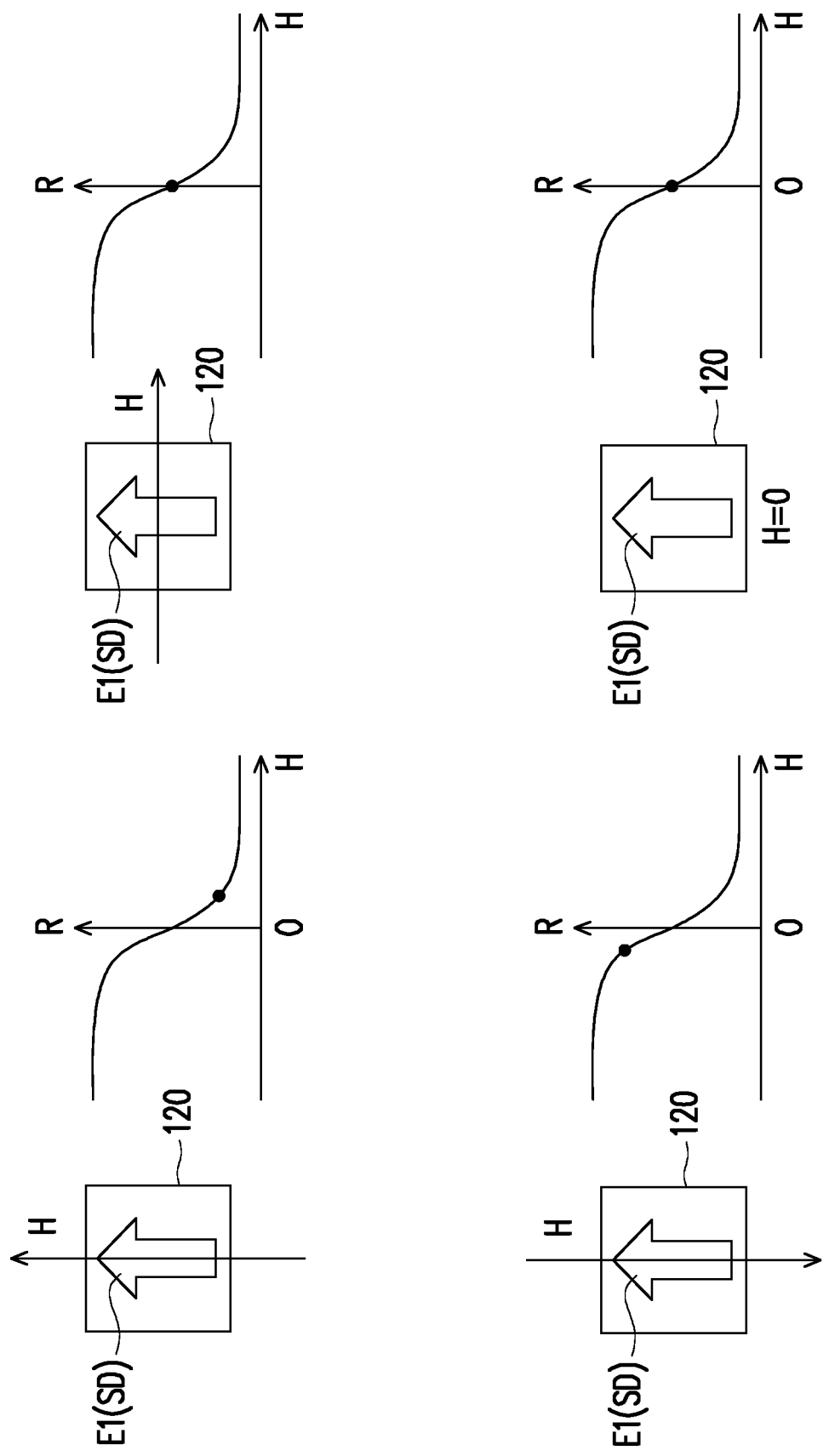
FIG. 3C shows the change in resistance of the single direction magneto-resistive sensor of FIG. 3A under the action of an external magnetic field in different directions and without an external magnetic field.

FIG. 1 is a top schematic structural view of a magnetic field sensing apparatus according to an embodiment of the present invention. FIG. 2A, FIG. 2B and FIG. 2C are respectively magnetic line of force simulation diagrams of an external magnetic field converted by a magnetic flux concentrator when an external magnetic field in different directions is applied to the magnetic field sensing apparatus of FIG. 1. FIG. 3A is a three-dimensional schematic view of a multilayer film structure of the single direction magneto-resistive sensor of FIG. 1. FIG. 3B shows the pinning direction of the single direction magneto-resistive sensor of FIG. 3A and the easy magnetization axis of the free layer. FIG. 3C shows the change in resistance of the single direction magneto-resistive sensor of FIG. 3A under the action of an external magnetic field in different directions and without an external magnetic field.

In the present embodiment, the magnetic field sensing apparatus 100 includes a substrate S, a magnetic flux concentrator 110, a plurality of single direction magneto-resistive sensors 120 and a calculator 130. The above elements will be explained in detail in the following paragraphs.

In the embodiments of the present invention, the substrate S is, for example, a blank silicon substrate, a glass substrate, or a silicon substrate having an integrated circuit. The present invention is not limited thereto. In the present embodiment, the directions D1 and D2 are, for example, directions parallel to the surface of the substrate S, and the direction D3 is, for example, a direction perpendicular to the surface of the substrate S.

In the embodiments of the present invention, the magnetic flux concentrator 110 refers to a component capable of concentrating magnetic lines of force of a magnetic field. The material of the magnetic flux concentrator 110 is, for example, a ferromagnetic material having a high magnetic permeability, such as a nickel-iron alloy, a cobalt-iron or a cobalt-iron-boron alloy, a ferrite magnet or other high magnetic permeability material, and the present invention is not limited thereto. How the external magnetic fields in different directions are affected by the magnetic flux concentrator 110 will be briefly explained in the following paragraphs.

Referring to FIG. 2A, when an external magnetic field $H_{D1}$ in a direction D1 is applied, the magnetic field at the position $P_X$ of the single direction magneto-resistive sensor 120 is converted to a magnetic field having a component in a direction D2 (i.e., parallel to the direction D2) due to the action of the magnetic flux concentrator 110, and therefore, the magnetic field sensing apparatus 100 can determine the magnitude of the external magnetic field in the direction D1 by sensing the magnitude of the external magnetic field in the direction D2 by the single direction magneto-resistive sensor 120.

Referring to FIG. 2B, when an external magnetic field $H_{D2}$ in the direction D2 is applied, the direction of the magnetic field at the position $P_Y$ of the single direction magneto-resistive sensor 120 is maintained in the direction substantially parallel to the direction D2 (i.e., parallel to the direction D2) by the action of the magnetic flux concentrator 110.

Referring to FIG. 2C, when an external magnetic field $H_{D3}$ in a direction D3 is applied, the magnetic field at the position $P_Z$ of the single direction magneto-resistive sensor 120 is converted to a magnetic field having a component in the direction D2 due to the action of the magnetic flux concentrator 110, and therefore, the magnetic field sensing module 100 can determine the magnitude of the external magnetic field in the direction D3 by sensing the magnitude of the external magnetic field component in the direction D2 by the single direction magneto-resistive sensor 120 in the direction D2.

In the embodiments of the present invention, the single direction magneto-resistive sensor 120 refers to a sensor whose resistance can be changed correspondingly by a change in an external magnetic field, and the type thereof includes a giant magneto-resistive sensor or a tunneling magneto-resistive sensor. Referring to FIG. 3A to FIG. 3C, in the present embodiment, the single direction magneto-resistive sensor 120 includes a pinning layer 122, a pinned layer 124, a spacer layer 126 and a free layer 128. The pinning layer 122 fixes the magnetization direction of the pinned layer 124, that is, the pinning direction E1, and the direction of the easy magnetization axis E2 of the free layer 128 is substantially perpendicular to the pinning direction E1. When the single direction magneto-resistive sensor 120 is a giant magneto-resistive sensor, the material of the spacer layer 126 is a non-magnetic metal. In addition, when the single direction magneto-resistive sensor 120 is a tunneling magneto-resistive sensor, the material of the spacer layer 126 is an insulating material. It should be noted that in the present embodiment, the term "single direction" means that the pinning directions E1 of the magneto-resistive sensors are the same direction, which is, for example, the direction D2.

The curve diagram in FIG. 3C shows the change in the resistance R of the single direction magneto-resistive sensor 120 with respect to the external magnetic field H. As shown in the upper left diagram of FIG. 3C, when the single direction magneto-resistive sensor 120 is applied with a magnetic field H in the same direction as the pinning direction E1, the resistance R thereof decreases, that is, the value of the resistance R corresponding to the black dot in the curve diagram, wherein the pinning direction is the sensing direction SD of the single direction magneto-resistive sensor 120. As shown in the lower left diagram of FIG. 3C, when the single direction magneto-resistive sensor 120 is applied with a magnetic field H in a direction opposite to the pinning direction E1, its resistance R increases, that is, the value of the resistance R corresponding to the black dot in the curve diagram. As shown in the upper right diagram of FIG. 3C, when the single direction magneto-resistive sensor 120 is applied with a magnetic field H perpendicular to the pinning direction E1, its resistance R remains unchanged, that is, the value of the resistance R corresponding to the black dot in the curve diagram. In addition, as shown in the lower right diagram of FIG. 3C, when the single direction magneto-resistive sensor 120 is not applied with a magnetic field, its resistance R remains unchanged, that is, the value of the resistance R corresponding to the black dot in the curve diagram.

In the embodiments of the present invention, the calculator 130 generally refers to a component that receives an electrical signal and performs different mathematical operations on the electrical signal, and may, for example, perform addition, subtraction, multiplication, division, or a combination thereof, or perform other different types of mathematical operations, and the present invention is not limited thereto.

After briefly explaining the functions of the above respective components, the arrangement relationship between the components will be described in detail in the following paragraphs.

Referring to FIG. 1, in the present embodiment, the magnetic flux concentrator 110 has a first and a second end portions EP1 and EP2 and a middle portion MP. The first end portion EP1 is opposite to the second end portion EP2. The first end portion EP1 is, for example, a left end portion, and the second end portion EP2 is, for example, a right end portion, but is not limited thereto. Moreover, each of the end portions EP1 and EP2 has opposite upper and lower sides. The middle portion MP is connected to the first and second end portions EP1 and EP2. More specifically, the magnetic flux concentrator 110 is, for example, a rectangle having opposite two short sides SE and two long sides LE, and any one of the two short sides SE is connected to the two long sides LE. The first end portion EP1 includes a left short side SE1 and left portions of the upper long side LE1 and the lower long side LE2. The second end portion EP2 includes a right short side SE2 and right portions of the upper long side LE1 and the lower long side LE2.

Referring to FIG. 1, in general, the single direction magneto-resistive sensors 120 are disposed beside the magnetic flux concentrator 110. The single direction magneto-resistive sensors 120 can be divided into a plurality of first and second single direction magneto-resistive sensors 1201 and 1202 according to different arrangement positions. In detail, the first single direction magneto-resistive sensors 1201 are disposed beside the first end portion EP1, and further, the first single direction magneto-resistive sensors 1201 are further divided into the first portion and third portions P1 and P3 according to different arrangement positions. The first and third portions P1 and P3 are respectively disposed on two opposite sides (upper and lower sides) of the first end portion EP1, and respectively disposed beside the upper long side LE1 and the lower long side LE2 belonging to the first end portion EP1. Similarly, the second single direction magneto-resistive sensors 1202 are disposed beside the second end portion EP2, and further, the second single direction magneto-resistive sensors 1202 are further divided into the second portion and fourth portions P2 and P4 according to different arrangement positions. The second and fourth portions P2 and P4 are respectively disposed on two opposite sides (upper and lower sides) of the second end portion EP2, and respectively disposed beside the upper long side LE1 and the lower long side LE2 belonging to the second end portion EP2.

Referring to FIG. 1, in the present embodiment, the first and third portions P1 and P3 are coupled to form a first full Wheatstone bridge FWH1, and the second and fourth portions P2 and P4 are coupled to form a second full Wheatstone bridge FWH2. That is, the plurality of first and second single direction magneto-resistive sensors 1201 and 1202 located beside the different end portions EP1 and EP2 are respectively coupled to form two full Wheatstone bridges FWH1 and FWH2. The calculator 130 is coupled to the first and second full Wheatstone bridges FWH1 and FWH2, and is configured to receive electrical signals from the first and second full Wheatstone bridges FWH1 and FWH2.

After the arrangement of each of the above components is explained, how the magnetic field sensing apparatus 100 measures the magnetic field components in different directions will be described in detail in the following paragraphs.

Figure 4A:
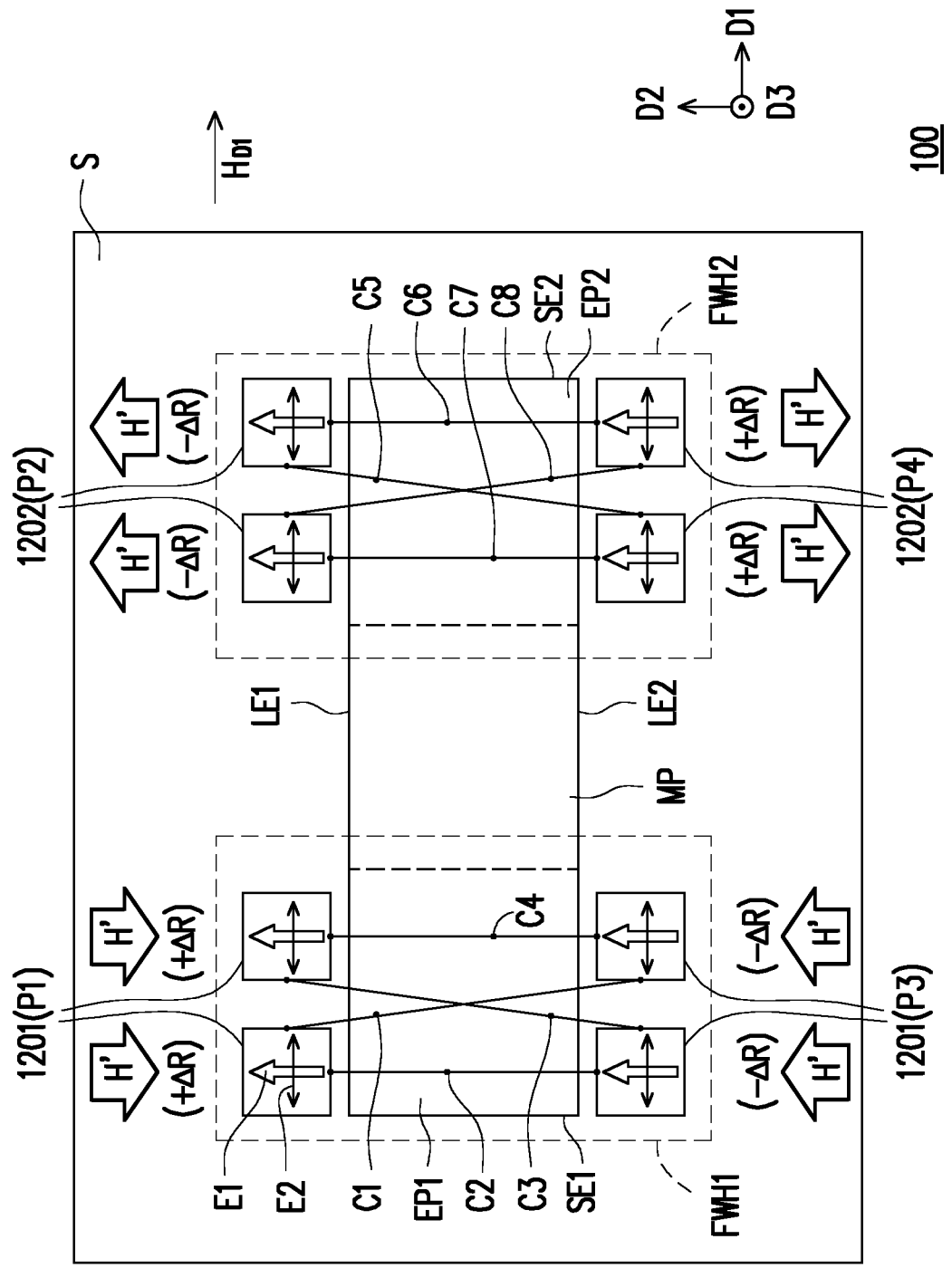
FIG. 4A to FIG. 4C are schematic views of the magnetic field sensing apparatus of FIG. 1 placed in external magnetic fields in different directions.
Figure 4B:
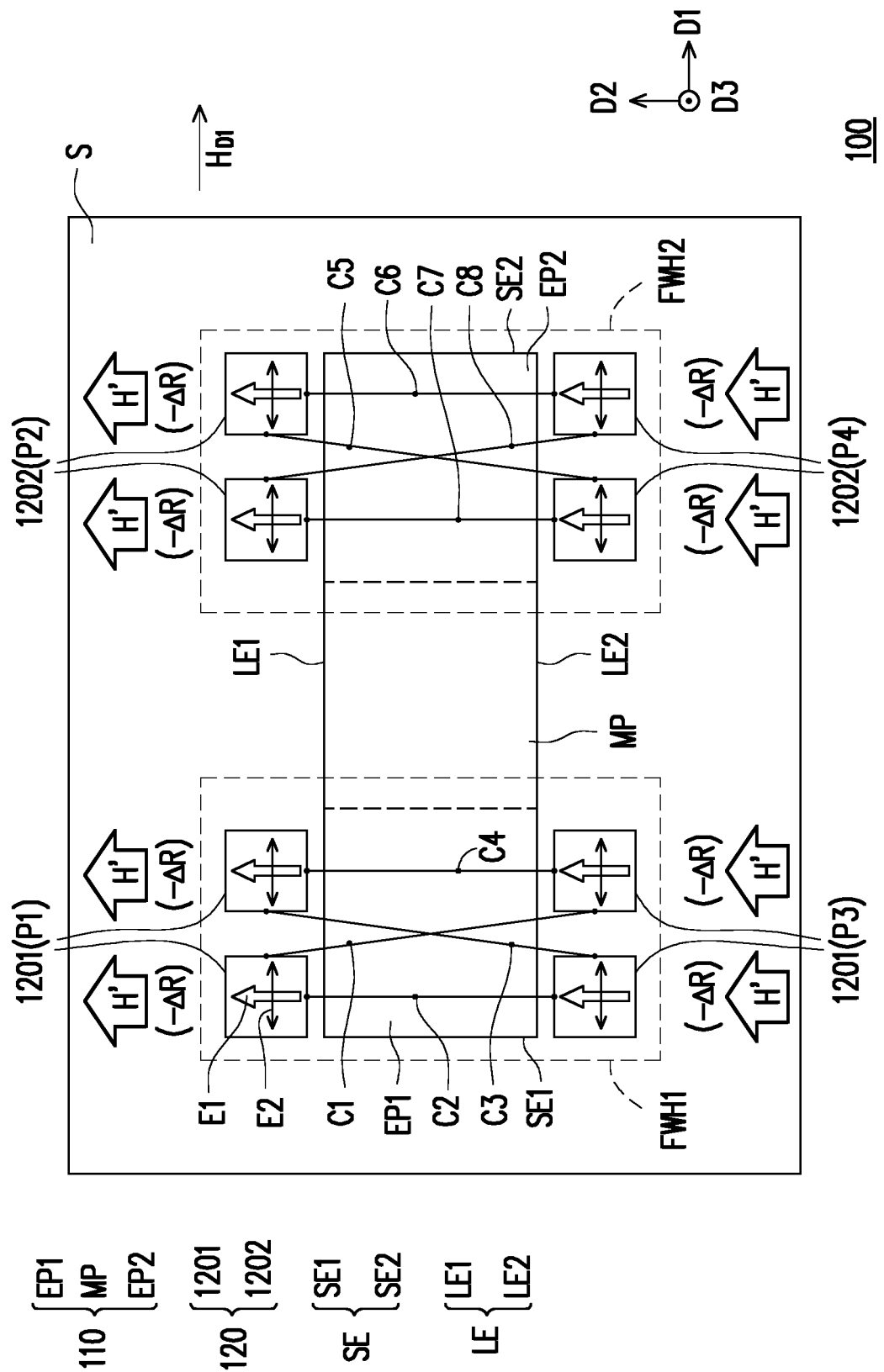
Figure 4C:
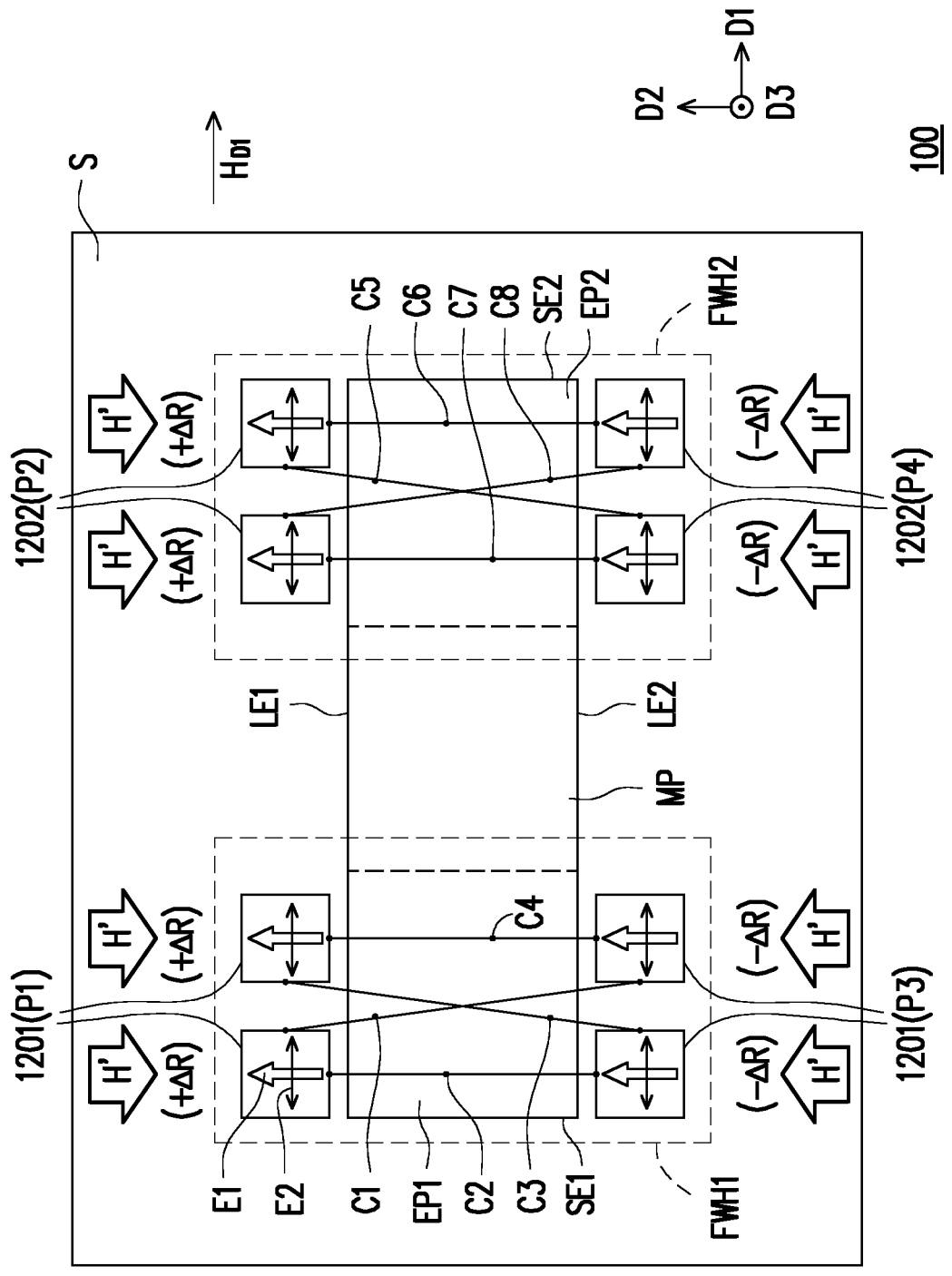

FIG. 4A to FIG. 4C are schematic views of the magnetic field sensing apparatus of FIG. 1 placed in external magnetic fields in different directions.

Referring to FIG. 2A and FIG. 4A, when the magnetic field sensing apparatus 100 is placed in the external magnetic field $H_{D1}$ whose magnetic field direction is the direction D1, the direction of the external magnetic field $H_{D1}$ may be affected due to the magnetic flux concentrator 110. That is, the magnetic field direction of the external magnetic field $H_{D1}$ will be changed from the original direction D1 to the magnetic field in the direction D2 or in the opposite direction of the direction D2 (the converted magnetic field is denoted as H'), and the single direction magneto-resistive sensors 120 at different positions will have different resistance changes due to different magnetic field directions.

In detail, the first and fourth portions P1 and P4 (upper left and lower right portions) may sense the magnetic field direction as the magnetic field component in the opposite direction of the direction D2 due to the relationship of the magnetic flux concentrator 110. Moreover, since the pinning direction E1 of the single direction magneto-resistive sensors 120 is the direction D2, the first and second single direction magneto-resistive sensors 1201 and 1202 of the first and fourth portions P1 and P4 cause their resistance values to produce a positive ΔR change because "the magnetic field direction of the converted external magnetic field $H_{D1}$" and the "pinning direction E1" are antiparallel to each other, where ΔR is greater than 0.

On the contrary, the second and third portions P2 and P3 (upper right and lower left portions) may sense the magnetic field direction as the magnetic field component in the direction D2 due to the relationship of the magnetic flux concentrator 110. Moreover, since the pinning direction E1 of the single direction magneto-resistive sensors 120 is the direction D2, the first and second single direction magneto-resistive sensors 1201 and 1202 of the second and third portions P2 and P3 cause their resistance values to produce a negative ΔR change because "the magnetic field direction of the converted external magnetic field $H_{D1}$" and the "pinning direction E1" are parallel to each other, where ΔR is greater than 0.

Therefore, since the resistance changes of the first and third portions P1 and P3 in the first full Wheatstone bridge FWH1 (the resistance value change of the first portion P1 changes is positive, and the resistance value change of the third portion P3 is negative) and the resistance changes of the second and fourth portions P2 and P4 in the second full Wheatstone bridge FWH2 (the resistance value change of the second portion P2 is negative, and the resistance value change of the third portion P4 is positive) are opposite to each other, the signal directions of the first and second electrical signals respectively output by the first and second full Wheatstone bridges FWH1 and FWH2 are opposite to each other. The calculator 130 performs subtraction according to the first and second electrical signals, and determines the magnitude and positive and negative values of the external magnetic field $H_{D1}$ in the direction D1 according to the result of the subtraction.

Referring to FIG. 2B and FIG. 4B, when the magnetic field sensing apparatus 100 is placed in the external magnetic field $H_{D2}$ of which the magnetic field direction is the direction D2, in general, the external magnetic field $H_{D2}$ is less likely to be affected by the magnetic flux concentrator 110 and change its direction. Therefore, the pinning direction E1 of the first and second single direction magneto-resistive sensors 1201 and 1202 in the first to fourth portions P1 to P4 and the direction of the external magnetic field $H_{D2}$ are parallel to each other, so that the resistance value of each single direction magneto-resistive sensor 120 produces a change in negative ΔR, where ΔR is greater than 0.

Therefore, since the resistance changes of the magneto-resistive sensors 120 used to form the two full Wheatstone bridges FWH1 and FWH2 are the same, that is, the voltage difference signal measured between the two voltage output ends in each of the full Wheatstone bridges FWH1 and FWH2 is 0, the magnitude of the external magnetic field $H_{D2}$ may not be sensed by the architecture of the first and second full Wheatstone bridges FWH1 and FWH2.

Referring to FIG. 2C and FIG. 4C, when the magnetic field sensing apparatus 100 is placed in the external magnetic field $H_{D3}$ whose magnetic field direction is the direction D3, the direction of the external magnetic field $H_{D3}$ may be affected due to the magnetic flux concentrator 110. That is, the magnetic field direction of the external magnetic field $H_{D3}$ will be changed from the original direction D2 to the magnetic field in the direction D2 or in the opposite direction of the direction D2, and the single direction magneto-resistive sensors 120 at different positions will have different resistance changes due to different magnetic field directions.

In detail, the first and portion portions P1 and P2 (upper left and upper right portions) may sense the magnetic field direction as the magnetic field component in the opposite direction of the direction D2 due to the relationship of the magnetic flux concentrator 110. Moreover, since the pinning direction E1 of the single direction magneto-resistive sensors 120 is the direction D2, the first and second single direction magneto-resistive sensors 1201 and 1202 of the first and second portions P1 and P2 cause their resistance values to produce a positive ΔR change because "the magnetic field direction of the converted external magnetic field $H_{D3}$" and the "pinning direction E1" are antiparallel to each other, where ΔR is greater than 0.

Referring to FIG. 4C with reference to FIG. 2C, on the contrary, the third and fourth portions P3 and P4 (lower left and lower right portions) may sense the magnetic field direction as the magnetic field component in the direction D2 due to the relationship of the magnetic flux concentrator 110. Moreover, since the pinning direction E1 of the single direction magneto-resistive sensors 120 is the direction D2, the first and second single direction magneto-resistive sensors 1201 and 1202 of the third and fourth portions P3 and P4 cause their resistance values to produce a negative ΔR change because "the magnetic field direction of the converted external magnetic field $H_{D3}$" and the "pinning direction E1" are parallel to each other, where ΔR is greater than 0.

Therefore, since the resistance changes of the first and third portions P1 and P3 in the first full Wheatstone bridge FWH1 (the resistance value change of the first portion P1 changes is positive, and the resistance value change of the third portion P3 is negative) and the resistance changes of the second and fourth portions P2 and P4 in the second full Wheatstone bridge FWH2 (the resistance value change of the second portion P2 is positive, and the resistance value change of the fourth portion P4 is negative) are the same, the signal directions of the first and second electrical signals respectively output by the first and second full Wheatstone bridges FWH1 and FWH2 are in the same direction. The calculator 130 performs addition according to the first and second electrical signals, and determines the magnitude and positive and negative values of the external magnetic field $H_{D3}$ in the direction D3 according to the result of the addition.

Based on the above, in the magnetic field sensing apparatus 100 of the present embodiment, since the pinning directions E1 of the single direction magneto-resistive sensors 120 are all designed to be in the same direction, the magnetic field sensing apparatus is simple in manufacturing process and lower in cost and has good stability. Moreover, the magnetic field sensing apparatus 100 respectively arranges the single direction magneto-resistive sensors 120 beside the opposite two end portions EP1 and EP2 of the magnetic flux concentrator 110 to respectively form two full Wheatstone bridges FWH1 and FWH2, and realizes multi-axial sensing by using the electrical signals output by the two full Wheatstone bridges FWH1 and FWH2 due to the influence of the external magnetic field (for example, biaxial sensing, the magnetic field components of the external magnetic field in two different directions D1 and D3 can be determined).Since the circuit architectures of the first and second full Wheatstone bridges FWH1 and FWH2 are distributed in the regions of the corresponding end portions EP1 and EP2, the circuit architectures are relatively simple and uncomplicated, and the manufacturing cost can be effectively reduced.

It should be noted here that the following embodiments use some of the foregoing embodiments, and the description of the same technical content is omitted. For the same component names, reference may be made to some of the foregoing embodiments, and the following embodiments are not described repeatedly. Further, in order to clearly show the drawings, the reference numerals of the same elements as those of the previous embodiment are omitted in the drawings described in the following paragraphs.

FIG. 5A to FIG. 7A are top schematic views of a magnetic field sensing apparatus of different embodiments of the present invention in a first time interval. FIG. 5B to FIG. 7B are respectively top schematic views of a magnetic field sensing apparatus of FIG. 5A and FIG. 7A in a second time interval. FIG. 8 is a top schematic view of a magnetic field sensing apparatus of another embodiment of the present invention.

Figure 5A:
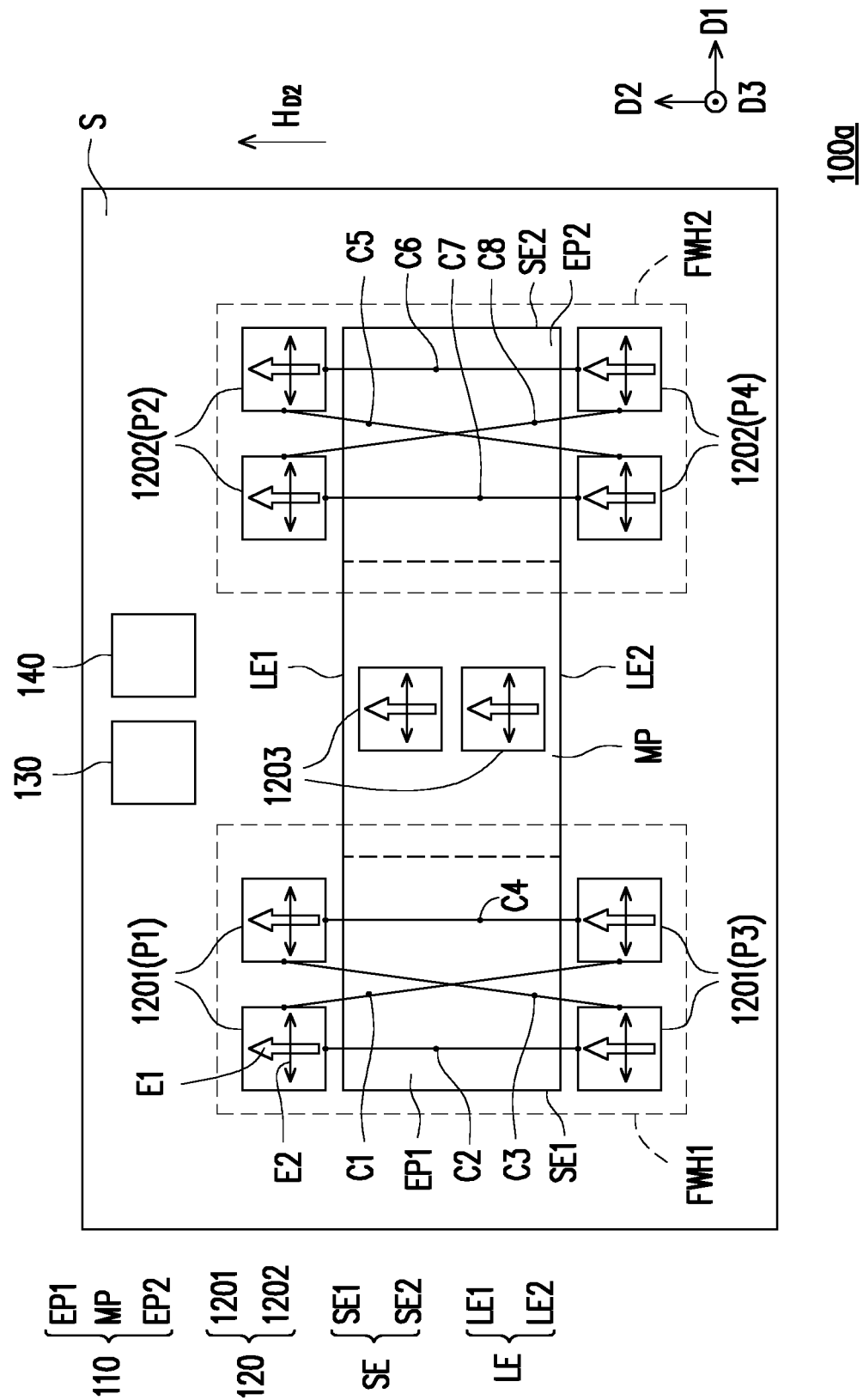

Referring to FIG. 5A, the magnetic field sensing apparatus 100a of FIG. 5A is substantially similar to the magnetic field sensing apparatus 100 of FIG. 1. The main difference is that: the magnetic field sensing apparatus 100a further includes a time division switching circuit 140, where the time division switching circuit 140 is coupled to the single direction magneto-resistive sensors 120 and is configured to switch at least a portion of the junctions between the single direction magneto-resistive sensors 120 to change the circuit connection between the magneto-resistive sensors 120, thereby forming another full Wheatstone bridge having a different architecture from the first and second full Wheatstone bridges FWH1 and FWH2. In the present embodiment, the magneto-resistive sensors 120 further include a plurality of third single direction magneto-resistive sensors 1203. In the present embodiment, the third single direction magneto-resistive sensors 1203 are disposed to overlap the middle portion MP.

In the present embodiment, the magnetic field sensing apparatus 100a can switch the circuit connections between the single direction magneto-resistive sensors 120 in different time intervals by using the time division switching circuit 140, and can measure the magnetic field components in the directions D1 to D3. In other words, the magnetic field sensing apparatus 100a of the present embodiment can realize tri-axial sensing. How the magnetic field sensing apparatus 100a measures the magnetic field components in the directions D1 to D3 will be described in sections in the following paragraphs.

Referring to FIG. 5A, in the first time interval, the time division switching circuit 140 enables the first and second single direction magneto-resistive sensors 1201 and 1202 to respectively form two full Wheatstone bridges FWH1 and FWH2 to measure the magnetic field components of in the directions D1 and D3. The principle of the magnetic field sensing apparatus 100a measuring the magnetic field components in the directions D1 and D3 is substantially similar to that of the magnetic field sensing apparatus 100 of FIG. 1, and will not be described herein.

Figure 5B:
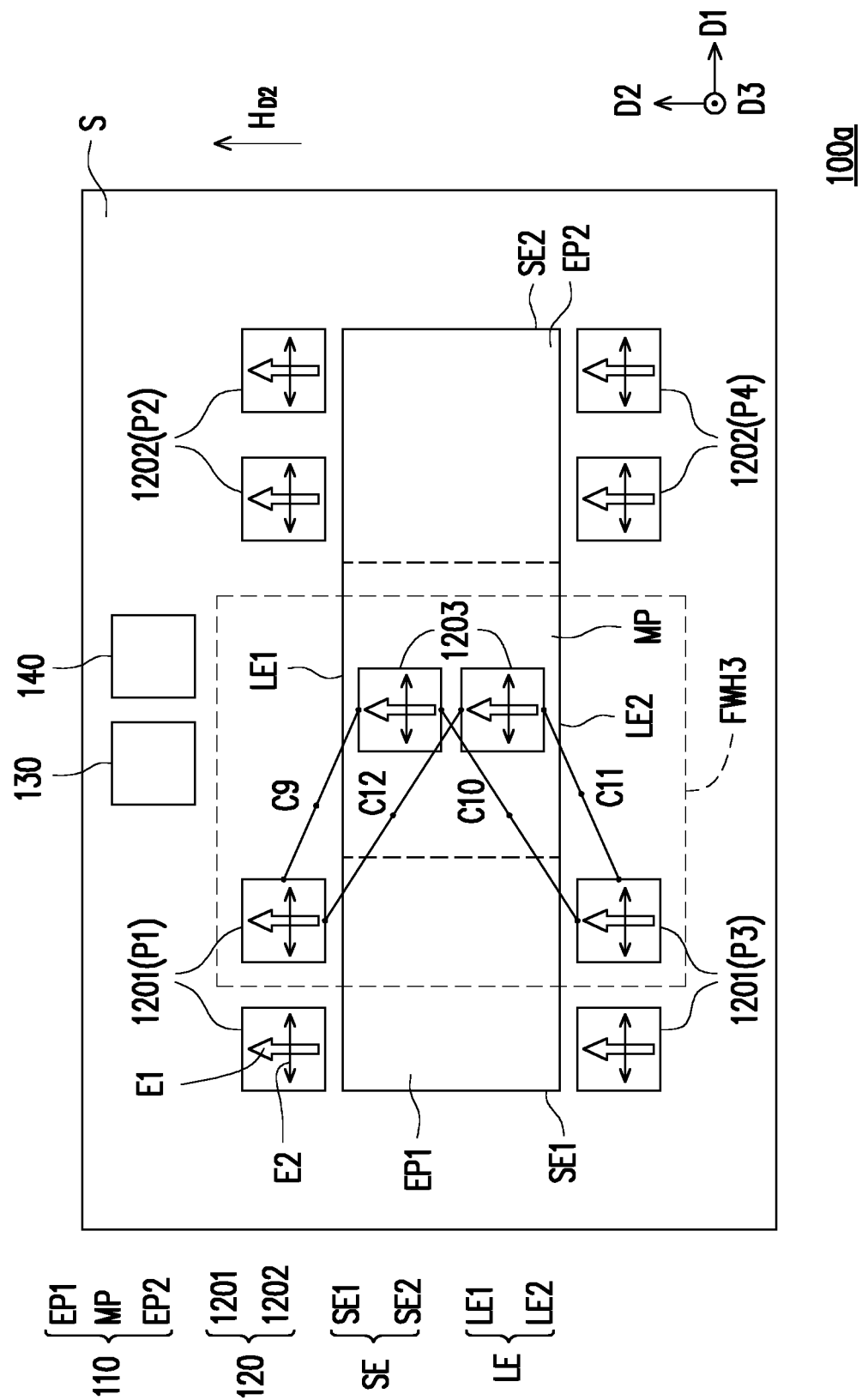

Referring to FIG. 5B, in the second time interval, the time division switching circuit 140 may select at least a portion of the single direction magneto-resistive sensors 120 from the first to fourth portions P1 to P4 to be coupled to the third single direction magneto-resistive sensors 1203 to form a third full Wheatstone bridge FWH3. For example, the time division switching circuit 140 selects, for example, two first single direction magneto-resistive sensors 1201 closest to the third single direction magneto-resistive sensor 1203 in the first and third portions P1 and P3 to perform the action of coupling of the full bridge.

Referring to FIG. 5B with reference to FIG. 2B, when the magnetic field sensing apparatus 100a is placed in the external magnetic field $H_{D2}$ whose magnetic field direction is the direction D2, the third single direction magneto-resistive sensors 1203 are shielded by the magnetic flux concentrator 110 and thus can not sense the external magnetic field $H_{D2}$, and the two first single direction magneto-resistive sensors 1201 cause their resistance values to produce a negative ΔR change due to the influence of the external magnetic field $H_{D2}$. Therefore, when the third full Wheatstone bridge FWH3 is affected by the external magnetic field $H_{D2}$, the resistance values of the third single direction magneto-resistive sensors 1203 are unchanged, and the resistance values of the two first single direction magneto-resistive sensors 1201a produce a negative ΔR change, so the voltage difference signal (i.e., the third electrical signal) measured between the two voltage output ends in the third full Wheatstone bridge FWH3 is a non-zero electrical signal, that is, the magnitude of the external magnetic field $H_{D2}$ can be sensed by the architecture of the third full Wheatstone bridge FWH3. The calculator 130 determines the magnitude and positive and negative values of the external magnetic field $H_{D2}$ in the direction D2 according to the third electrical signal.

Based on the above, in other embodiments, the time division switching circuit 140 may also select other first and second single direction magneto-resistive sensors 1201 and 1202 to be coupled to the third single direction magneto-resistive sensors 1203 to form a third full Wheatstone bridge FWH3. The present invention is not limited thereto.

Figure 6A:
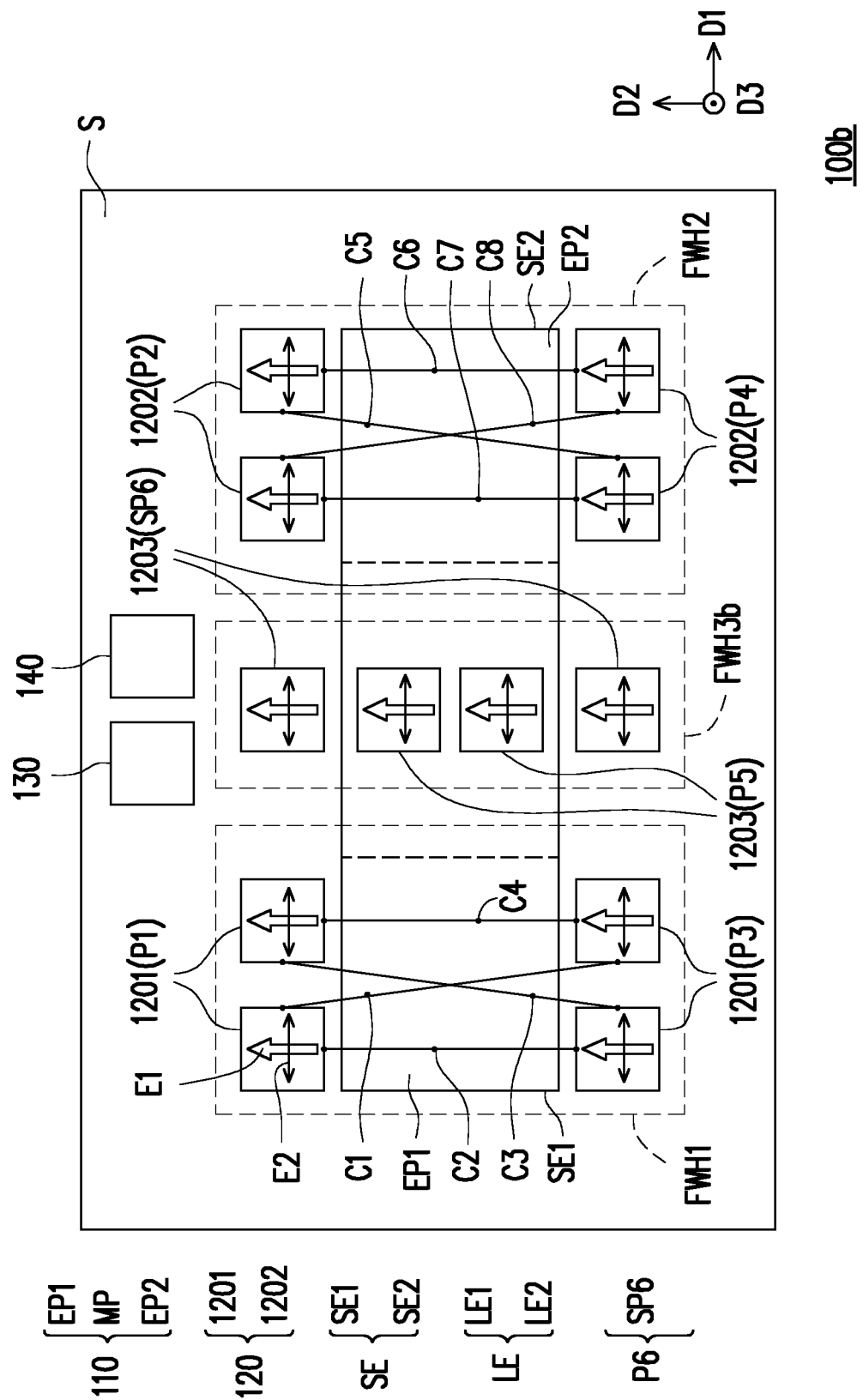

Referring to FIG. 6A, the magnetic field sensing apparatus 100b of FIG. 6A is substantially similar to the magnetic field sensing apparatus 100a of FIG. 5A. The main difference is that: in the magnetic field sensing apparatus 100b, the third single direction magneto-resistive sensors 1203 can be divided into a fifth and a sixth portions P5 and P6 according to different arrangement positions. The sixth portion P6 further includes two sixth sub-portions SP6. The fifth portion P5 is disposed to overlap the middle portion MP, and the two sixth sub-portions SP6 are respectively disposed beside two opposite sides (upper and lower sides) of the middle portion MP and not disposed to overlap the middle portion MP.

Referring to FIG. 6A, in the first time interval, the time division switching circuit 140 enables the first and second single direction magneto-resistive sensors 1201 and 1202 to respectively form two full Wheatstone bridges FWH1 and FWH2 to measure the magnetic field components of in the directions D1 and D3. The principle of the magnetic field sensing apparatus 100a measuring the magnetic field components in the directions D1 and D3 is substantially similar to that of the magnetic field sensing apparatus 100 of FIG. 1, and will not be described herein.

Figure 6B:
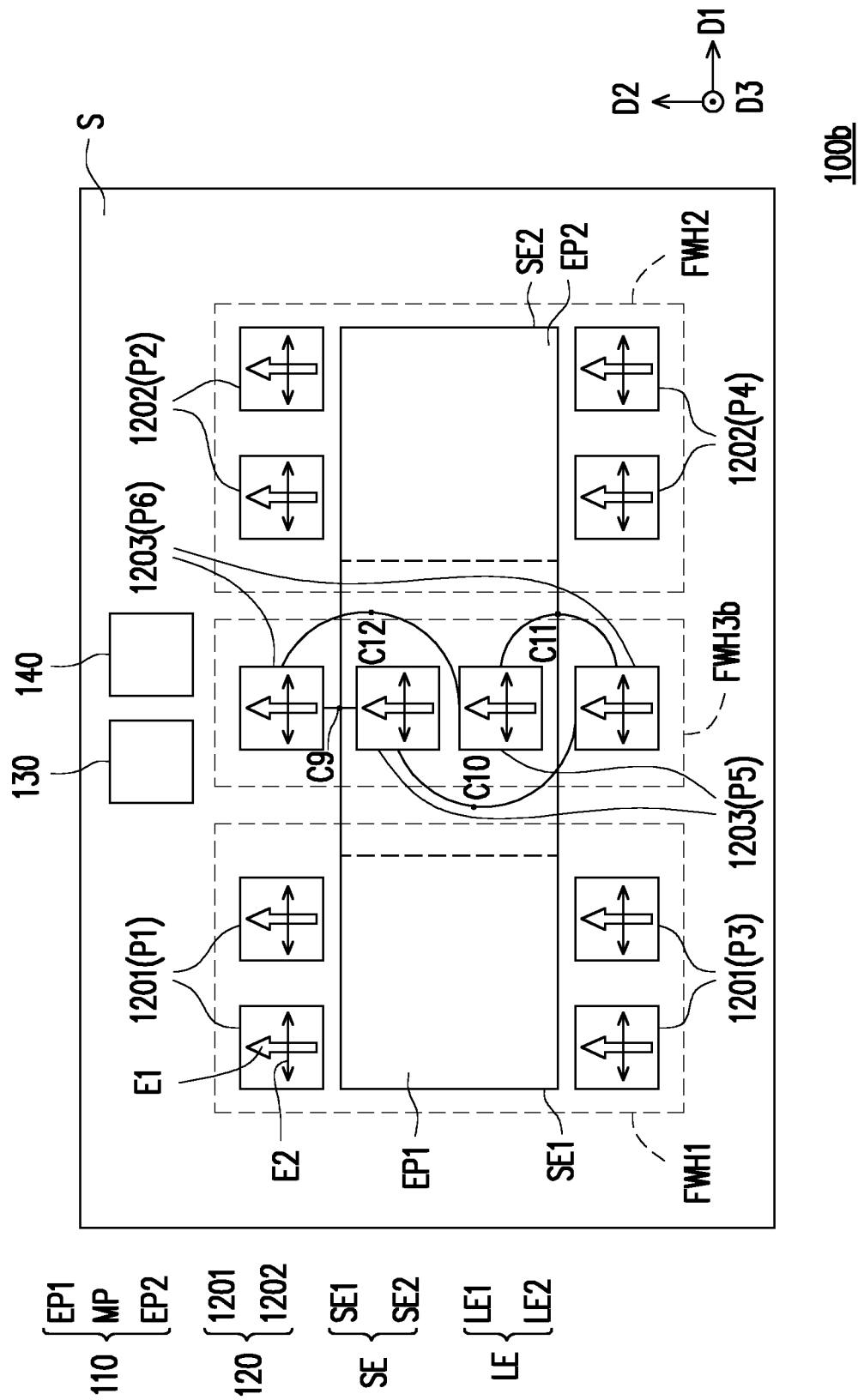

Referring to FIG. 6B, in the second time interval, the time division switching circuit 140 couples the fifth and sixth portions P5 and P6 to form the third full Wheatstone bridge FWH3b. Based on the principle similar to that of the magnetic field sensing apparatus 100a of FIG. 5B, when the third full Wheatstone bridge FWH3b is affected by the external magnetic field $H_{D2}$, the third single direction magneto-resistive sensor 1203 belonging to the sixth portion P6 of the third full Wheatstone bridge FWH3b changes the resistance value due to the external magnetic field $H_{D2}$, and the one belonging to the fifth portion P5 does not. Therefore, the third full Wheatstone bridge FWH3b can output a non-zero third electrical signal. The calculator 130 determines the magnitude and positive and negative values of the external magnetic field $H_{D2}$ in the direction D2 according to the third electrical signal.

Figure 7A:
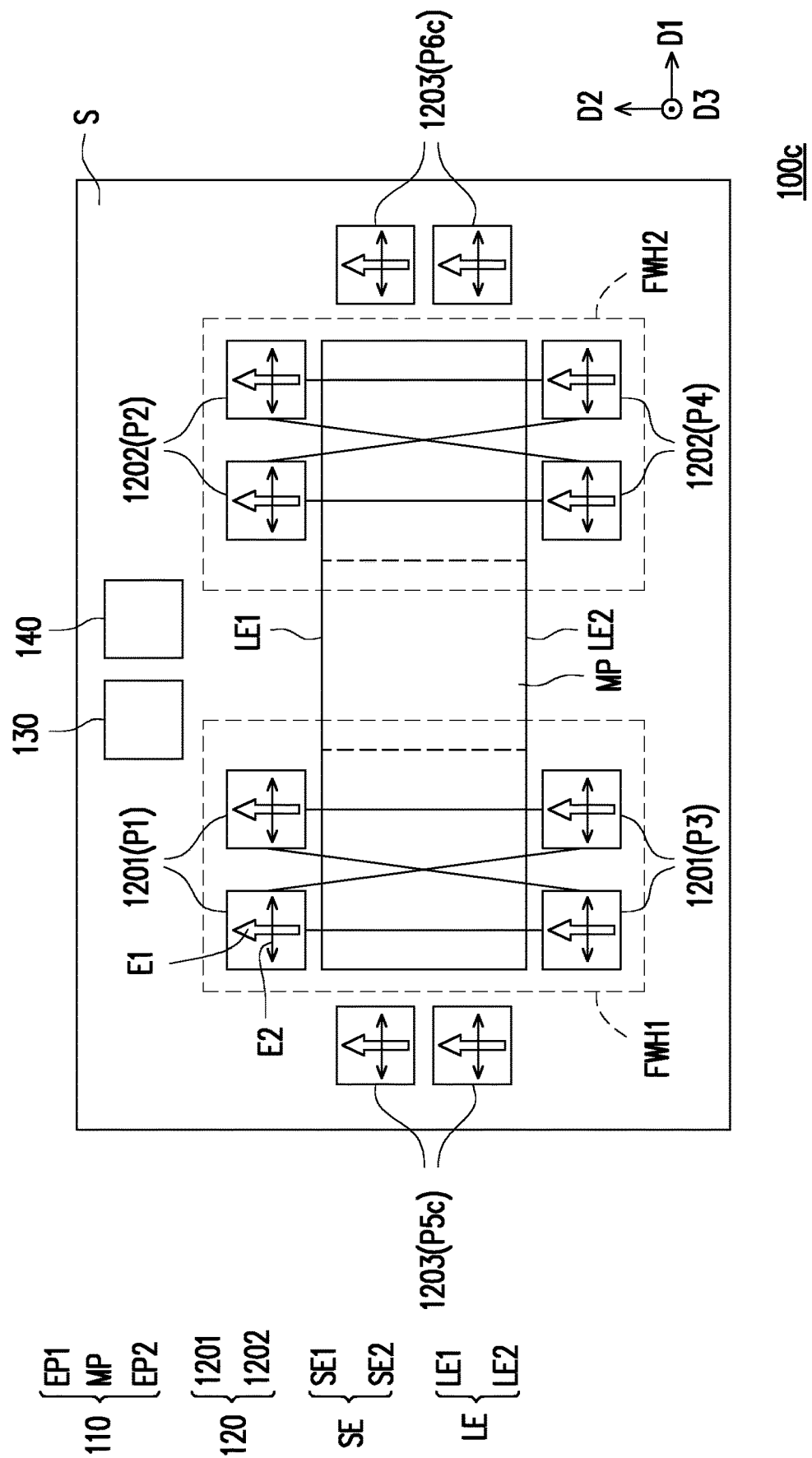
Figure 8:
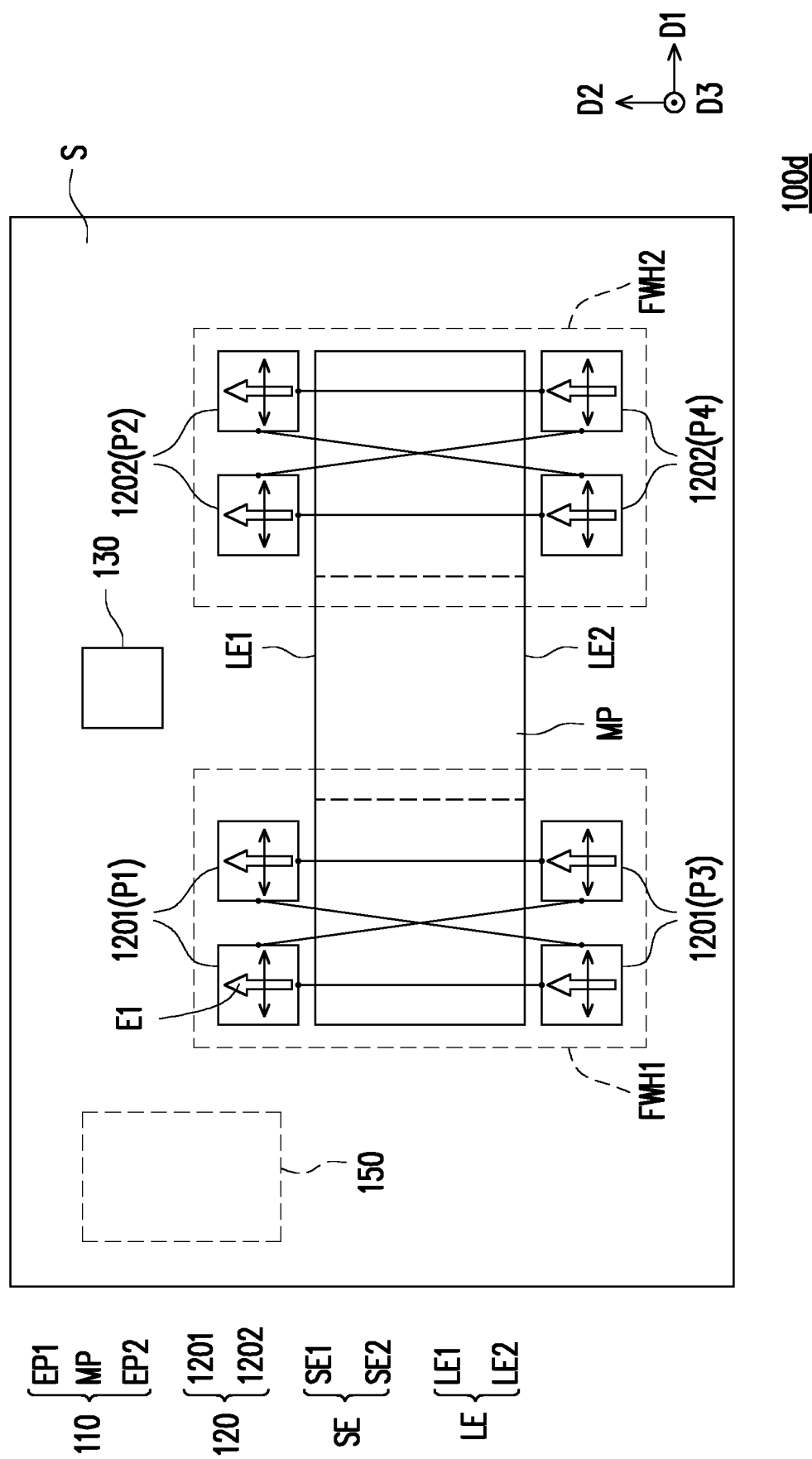
FIG. 8 is a top schematic view of a magnetic field sensing apparatus of another embodiment of the present invention.

Referring to FIG. 7A, the magnetic field sensing apparatus 100c of FIG. 7A is substantially similar to the magnetic field sensing apparatus 100b of FIG. 6A. The main difference is that: the third single direction magneto-resistive sensors 1203 are disposed at different positions. In detail, the third single direction magneto-resistive sensors 1203 include a fifth and a sixth portions P5c and P6c. The fifth portion P5c is disposed beside the short side (i.e., the left short side SE1) belonging to the first end portion EP1 and not disposed to overlap the first end portion EP1, and the sixth portion P6c is disposed beside the short side (i.e., the right short side SE2) belonging to the second end portion EP2 and not disposed to overlap the second end portion EP2.

Referring to FIG. 7A, in the first time interval, the time division switching circuit 140 enables the first and second single direction magneto-resistive sensors 1201 and 1202 to respectively form two full Wheatstone bridges FWH1 and FWH2 to measure the magnetic field components of in the directions D1 and D3. The principle of the magnetic field sensing apparatus 100c measuring the magnetic field components in the directions D1 and D3 is substantially similar to that of the magnetic field sensing apparatus 100 of FIG. 1, and will not be described herein.

Figure 7B:
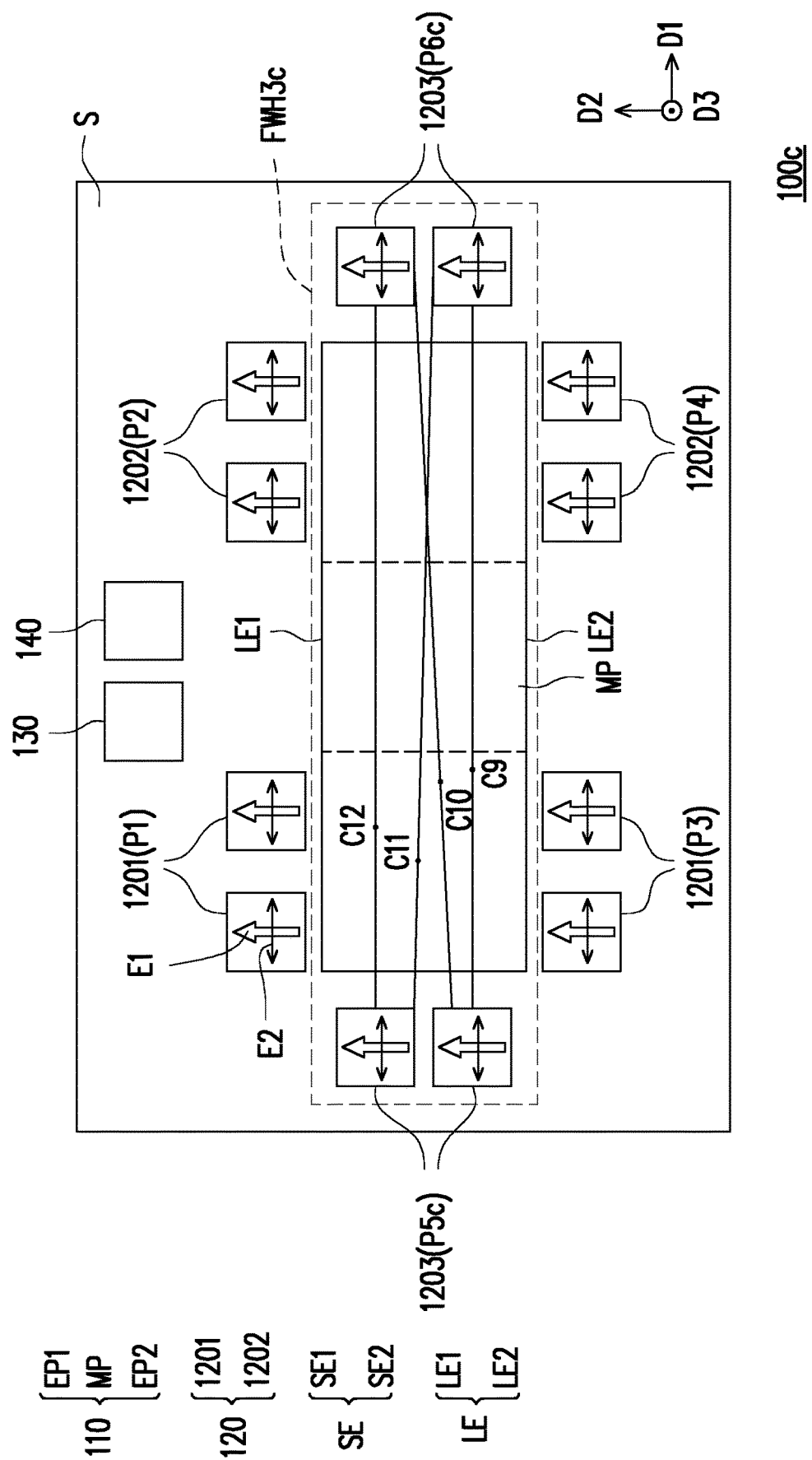

Referring to FIG. 7B, in the second time interval, the time division switching circuit 140 couples the fifth and sixth portions P5c and P6c to form the third full Wheatstone bridge FWH3c. Referring to FIG. 2B, when the third full Wheatstone bridge FWH3c is affected by the external magnetic field $H_{D2}$, the external magnetic field $H_{D2}$ at the fifth and sixth portions P5c and P6c is affected by the magnetic flux concentrator 110 to change the magnetic field direction to the direction D1, and therefore, the third single direction magneto-resistive sensors 1203 may sense the magnetic field in the direction D1 due to the relationship of the magnetic flux concentrator 110, and may change its resistance. Therefore, the third full Wheatstone bridge FWH3c can output a non-zero third electrical signal. The calculator 130 determines the magnitude and positive and negative values of the external magnetic field $H_{D2}$ in the direction D2 according to the third electrical signal.

Referring to FIG. 8, the magnetic field sensing apparatus 100d of FIG. 8 is substantially similar to the magnetic field sensing apparatus 100 of FIG. 1. The main difference is that: the magnetic field sensing apparatus 100d further includes a single direction magneto-resistive sensing element 150 coupled to the calculator 130. In the above description, the first and second full Wheatstone bridges FWH1 and FWH2 formed by the single direction magneto-resistive sensors 120 are configured to measure the magnetic field components in the directions D1 and D3, and the single direction magneto-resistive sensing element 150 is configured to measure the magnetic field component in the direction D2, so that the magnetic field sensing apparatus 100d of the present embodiment can realize tri-axial sensing. That is, the single direction magneto-resistive sensing element 150 can be affected by the external magnetic field to output an electrical signal (i.e., the third electrical signal), and the calculator 130 can determine the magnetic field component in the direction D2 according to the electrical signal output by the single direction magneto-resistive sensing element 150. A person skilled in the art can use a variety of different magneto-resistive sensors to form an single direction magneto-resistive sensing element 150 that is functionally capable of measuring the magnetic field component in the direction D2. The present invention is not limited thereto.

Based on the above, in the magnetic field sensing apparatus of the present embodiment, since the pinning directions of the single direction magneto-resistive sensors are all designed to be in the same direction, the magnetic field sensing apparatus is simple in manufacturing process and lower in cost and has good stability. Moreover, the magnetic field sensing apparatus respectively arranges the single direction magneto-resistive sensors beside the opposite two end portions of the magnetic flux concentrator to respectively form two full Wheatstone bridges, and realizes multiaxial sensing by using the electrical signals output by the two full Wheatstone bridges due to the influence of the external magnetic field. The circuit architectures are relatively simple and uncomplicated, and the manufacturing cost can be effectively reduced.

Although the present invention has been disclosed with the above embodiments, it is not intended to limit the present invention. Any person having ordinary skill in the art can make some changes and modifications without departing from the spirit and scope of the present invention. Therefore, the protection scope of the present invention shall be defined by the appended claims.

What is claimed is:

1. A magnetic field sensing apparatus, comprising:
a magnetic flux concentrator, comprising a first end portion and a second end portion opposite to each other;
a plurality of single direction magneto-resistive sensor, having the same pinning direction, wherein the single direction magneto-resistive sensors are disposed beside the magnetic flux concentrator, and the single direction magneto-resistive sensors further comprise a plurality of first single direction magneto-resistive sensors and a plurality of second single direction magneto-resistive sensors;
a calculator coupled to the magneto-resistive sensors; and
a time division switching circuit coupled to the magneto-resistive sensors,
wherein,
the first single direction magneto-resistive sensors are disposed beside the first end portion, the first single direction magneto-resistive sensors further comprising a first portion and a third portion respectively disposed on two opposite sides of the first end portion, and the first portion and the third portion being coupled to form a first full Wheatstone bridge,
the second single direction magneto-resistive sensors are disposed beside the second end portion, the second single direction magneto-resistive sensors further comprising a second portion and a fourth portion respectively disposed on two opposite sides of the second end portion, and the second portion and the fourth portion being coupled to form a second full Wheatstone bridge,
the first full Wheatstone bridge is affected by an external magnetic field to output a first electrical signal, the second full Wheatstone bridge is affected by the external magnetic field to output a second electrical signal, and the calculator determines magnetic field components of the external magnetic field in two different directions according to the first electrical signal and the second electrical signal,
the magneto-resistive sensors further comprise a plurality of third single direction magneto-resistive sensors, the third single direction magneto-resistive sensors being disposed beside the magnetic flux concentrator,
the magnetic flux concentrator further comprises a middle portion, the middle portion being located between the first end portion and the second end portion and connected to the first end portion and the second end portion,
the magnetic flux concentrator further comprises a middle portion, the middle portion being located between the first end portion and the second end portion and connected to the first end portion and the second end portion,
at least a portion of the third single direction magneto-resistive sensors are disposed to overlap the middle portion, and
in a first time interval, the time division switching circuit couples the first portion and the third portion to form the first full Wheatstone bridge, and couples the second portion and the fourth portion to form the second full Wheatstone bridge, so that the calculator determines magnetic field components of the external magnetic field in the two different directions according to the first electrical signal and the second electrical signal.

2. The magnetic field sensing apparatus according to claim 1, wherein,
in a second time interval, the time division switching circuit couples at least a portion of the single direction magneto-resistive sensors selected from the first portion, the second portion, the third portion and the fourth portion to the third single direction magneto-resistive sensors to form a third full Wheatstone bridge, the third full Wheatstone bridge is affected by the external magnetic field to output a third electrical signal, and the calculator determines a magnetic field component of the external magnetic field in the other direction according to the third electrical signal, wherein the magnetic field component in the other direction is different from the magnetic field components in the two different directions.

3. The magnetic field sensing apparatus according to claim 1, wherein,
the third single direction magneto-resistive sensors further comprise a fifth portion and a sixth portion,
the fifth portion is disposed to overlap the middle portion, and the sixth portion further comprises two sixth sub-portions, the two sixth sub-portions being respectively disposed on two opposite sides of the middle portion and not disposed to overlap the middle portion.

4. The magnetic field sensing apparatus according to claim 3, wherein,
in a second time interval, the time division switching circuit couples the fifth portion and the sixth portion to form a third full Wheatstone bridge, the third full Wheatstone bridge outputs a third electrical signal according to the external magnetic field, and the calculator determines a magnetic field component of the external magnetic field in the other direction according to the third electrical signal, wherein the magnetic field component in the other direction is different from the magnetic field components in the two different directions.

5. The magnetic field sensing apparatus according to claim 1, wherein,
the magneto-resistive sensors further comprise a plurality of third single direction magneto-resistive sensors, the third single direction magneto-resistive sensors being disposed beside the magnetic flux concentrator and comprising a fifth portion and a sixth portion,
the magnetic flux concentrator comprises two short sides and two long sides, any one of the two short sides being connected to the two long sides, and the first end portion and the second end portion respectively comprising a portion of the two long sides and one of the two short sides, wherein,
the first portion and the third portion are respectively disposed beside the two long sides belonging to the first end portion,
the second portion and the fourth portion are respectively disposed beside the two long sides belonging to the second end portion,
the fifth portion is disposed beside the short side belonging to the first end portion and not disposed to overlap the first end portion, and
the sixth portion is disposed beside the short side belonging to the second end portion and not disposed to overlap the second end portion.

6. The magnetic field sensing apparatus according to claim 5, wherein,
in a second time interval, the time division switching circuit couples the fifth portion and the sixth portion to form a third full Wheatstone bridge, the third full Wheatstone bridge outputs a third electrical signal according to the external magnetic field, and the calculator determines a magnetic field component of the external magnetic field in the other direction according to the third electrical signal, wherein the magnetic field component in the other direction is different from the magnetic field components in the two different directions.

7. The magnetic field sensing apparatus according to claim 1, further comprising a single direction magnetic field sensing element coupled to the calculator, wherein the single direction magnetic field sensing element is affected by the external magnetic field to output a third electrical signal, and the calculator determines a magnetic field component of the external magnetic field in the other direction according to the third electrical signal, wherein the magnetic field component in the other direction is different from the magnetic field components in the two different directions.

8. The magnetic field sensing apparatus according to claim 1, wherein the type of the single direction magneto-resistive sensor comprises a giant magneto-resistive sensor or a tunneling magneto-resistive sensor.

* * * * *